United States Patent
Lai et al.

(10) Patent No.: US 6,791,146 B2
(45) Date of Patent: Sep. 14, 2004

(54) SILICON CONTROLLED RECTIFIER STRUCTURE WITH GUARD RING CONTROLLED CIRCUIT

(75) Inventors: Chen-Shang Lai, Taichung (TW); Meng-Huang Liu, Hsin-Chu (TW); Shin Su, Taipei (TW); Tao-Cheng Lu, Kaohsiung (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/178,235

(22) Filed: Jun. 25, 2002

(65) Prior Publication Data

US 2003/0234405 A1 Dec. 25, 2003

(51) Int. Cl.[7] .......................... H01L 23/62; H01L 29/74; H01L 31/111
(52) U.S. Cl. ...................... 257/362; 257/162; 257/167; 257/173; 257/175
(58) Field of Search ................................ 257/107, 122, 257/123, 141, 146, 162, 167, 173, 175, 362

(56) References Cited

U.S. PATENT DOCUMENTS 6,465,848 B2 * 10/2002 Ker et al. .................... 257/355

* cited by examiner

Primary Examiner—Steven Loke

(57) ABSTRACT

The present invention provides a PMSCR (bridging modified lateral modified silicon controlled rectifier having first conductivity type) with a guard ring controlled circuit. The present invention utilizes controlled circuit such as switch to control functionally of guard ring of PMSCR. In normal operation, the switch is of low impedance such that the guard ring is short to anode and collects electrons to enhance the power-zapping immunity. Furthermore, during the ESD (electrostatic discharge) event, the switch is of high impedance such that the guard ring is non-functional. Thus, the PMSCR with guard ring control circuit can enhance both the ESD performance and the power-zapping immunity in the application of the HV (high voltage) pad.

10 Claims, 3 Drawing Sheets

SILICON CONTROLLED RECTIFIER STRUCTURE WITH GUARD RING CONTROLLED CIRCUIT

BACKGROUND OF THE INVENTION

1. Field of the Invention

The present invention generally relates to a structure of silicon-controlled rectifier (SCR) in a CMOS (complementary metal oxide semiconductor) device, and more particularly to bridging modified lateral silicon controlled rectifier of first conductivity type (PMSCR) with guard ring controlled circuit for electrostatic discharge (ESD) protection.

2. Description of the Prior Art

SCRs (Silicon controlled rectifier) are knows as thyristors. The SCRs are used extensively in power device application because of the capability to switch from a very high impedance state to a very low impedance state. For the same reason a properly designed SCR can also be a very efficient electrostatic discharge (ESD) protection circuit.

Referring to FIG. 1, the PMSCR structure (bridging modified lateral silicon controlled rectifier of first conductivity type) 110 with guard ring is formed within a substrate 100. The PMSCR structure 110 with guard ring having a first lightly doped well region 112 of a second conductivity type such as N type, and a second lightly doped well region 114 of the first conductivity type such as P type. A N+ region 118 is formed in the first lightly doped well region 112, and is electrically coupled to the anode 150, and a P+ region 124 is formed in the second lightly doped well region 114, and is electrically coupled to the cathode 160. A P+ region 120 is formed in the first lightly doped well region 112, and is electrically coupled to the anode 150. A N+ region 122 is formed in the second lightly doped well region 114, and is electrically coupled to the cathode 160. An N+ region 126 is formed in the first lightly doped well region 112, and is electrically coupled to the anode 150. A P+ region 128 is formed in the first lightly doped well region 112 and the second lightly doped well region 114 such that the P+ region 128 overlaps a junction 116 between the first lightly doped well region 112 and second lightly doped well region 114. A field insulator region 130 is formed in the first lightly doped well region 112, and is formed between N+ region 118 and P+ region 120. In addition, another field insulator region 132 is formed in the first lightly doped well region 112, and is formed between the P+ region 120 and N+ region 126. Then, a field insulator region 134 is formed in the first lightly doped well region 112, and is formed between the N+ region 126 and P+ region 128. A field insulator region 136 is formed in the second lightly doped well region 114, and is formed between the P+ region 128 and N+ region 122. Next, a field insulator region 138 is formed in the second lightly doped well region 114, and is formed between the N+ region 122 and P+ region 124.

In the PMSCR structure, an additional N+ region 126 is used as a guard ring to collect the electrons that from the cathode 160 to the anode 150, such that when the trigger voltage is applied to the PMSCR structure 110, the guard ring can prevent damage from voltage latch-up during normal operation. Therefore, the power-zapping immunity of the PMSCR structure can be improved. Nevertheless, in the PMSCR structure 110, the worse ESD performance since the N guard ring will collect the electrons when SCR triggers.

Referring to FIG. 2 is a schematic representation showing a PMSCR 210 with an additional N well guard ring structure 214. The PMSCR with N well guard ring structure 210 is formed within the substrate 200. The PMSCR with N well guard ring structure 210 having a first lightly doped well region 212 of the second conductivity type such as N type, a second lightly doped well region 214 of the second conductivity type, and a third lightly doped well region 216 of first conductivity type, wherein the second lightly doped well region is used as a guard ring to collect the electrons. An N+ region 224 is formed in the first lightly doped well region 212, and is electrically coupled to the anode 260. A P+ region 226 is formed in the first lightly doped well region 216, and is electrically coupled to the anode 260. A N+ region 228 is formed in the third lightly doped well region 216, and is electrically coupled to the cathode 280. A P+ region 230 is formed in the third lightly doped well region 216, and is electrically coupled to the cathode 280. A N+ region 232 instead of P+ region 128 of the PMSCR with N guard ring 110 (as shown in FIG. 1) is formed in the second lightly doped well region 214, and is coupled to a high voltage node 270. An P+ region 234 instead of the N+ region 126 of the PMSCR with N ring structure 110 is formed between the substrate 200 and the first lightly doped well region 212, such that the P+ region 234 overlaps a first junction 218 between the substrate 200 and the first lightly doped well region 212.

Then, a field insulator region 250 is formed in the first lightly doped well region 212, and is formed between the N+ region 224 and the P+ region 226. A field insulator region 252 is formed in the first lightly doped well region 212, and is formed between the P+ region 226 and P+ region 234. A field insulator region 254 is formed between the substrate 200 and the second lightly doped well region 214, such that the field insulator region 254 overlaps a second junction 220 between the substrate 200 and the second lightly doped well region 214. A field insulator region 256 is formed in the second lightly doped well region 214 and the third lightly doped well region 216, such that the field insulator region 256 overlaps a third junction 222 between the second lightly doped well region 214 and the third lightly doped well region 216. A field insulator region 258 is formed in the third lightly doped well region 216. As the PMSCR with the N guard ring structure 110, the N well guard ring 214 is used to collect the electrons from the cathode 280 toward the anode 260. Even though the power-zapping immunity is improved when SCR triggers, nevertheless the N well guard ring 214 may attach to the same or another high voltage to collect electrons such that the ESD performance will be degraded.

For PMSCR with guard ring 110 (as shown in FIG. 1) or 210 (as shown in FIG. 2), when the voltage of the anode 150 or 260 rises to the breakdown voltage of the junction between N-well 112 or 212 and P+ 128 or 234, lots of electron-hole pairs will be generated in this junction. Electrons are attracted by the high potential of the anode 150 or 260, and holes by the low potential of the cathode 160 or 280. When electrons flow into the anode, the parasitic PNP BJT will turn on and inject holes into P-well 114 or 216. When holes flow into the cathode, the parasitic NPN BJT will turn on and inject electrons in to N-well 112 or 212. Thus, these two BJT turn on each other and a positive feedback starts. It causes PMSCR snapback and enters the low-impedance holding region. This holding region can bypass ESD current effectively during ESD event. The power zapping issue, however, will occur if it enters the holding region during normal operation. As a result, N+ 126 or N-well 214 guard ring can collect electrons to prevent them from flowing into the anode to turn on the parasitic PNP BJT, and then prevent PMSCR from entering the holding region and causing the power-zapping issue. During ESD event, however, the ESD robustness of PMSCR will be worse since it cannot enter the holding region easily.

SUMMARY OF THE INVENTION

It is an object of this invention to provide a structure with a controlled N guard ring/controlled N well guard ring that is controlled by a control circuit such that the high/low impedance depends on an ESD (electrostatic discharge) event.

It is still another object of this invention to provide a structure with a controlled N guard ring/controlled N well guard ring that is controlled by a control circuit and the high/low impedance depends on a normal operation such that the power-zapping immunity for HV (high voltage) pad can be improved.

It is yet another object of this invention to provide a structure with a controlled N guard ring/controlled N well guard ring which is controlled by a control circuit such that the controlled N well guard ring is non-functional when SCR triggers, and won't collect electrons.

According to aforementioned objects, the present invention provides a PMSCR (bridging modified lateral silicon controlled rectifier having first conductivity type) with a controlled guard ring structure. The guard ring is controlled by a switch that can control the guard ring to collect electrons or non-functional. In normal operation, the switch is of low impedance (the MOS transistor exhibits on state), and guard ring is short to anode or other high voltage node, such that the guard ring can collect electrons to enhance the power zapping immunity. Furthermore, during the ESD event, the switch is of high impedance (the MOS transistor exhibits off state), and guard ring is useless. Thus, the ESD performance will not be degraded.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1:
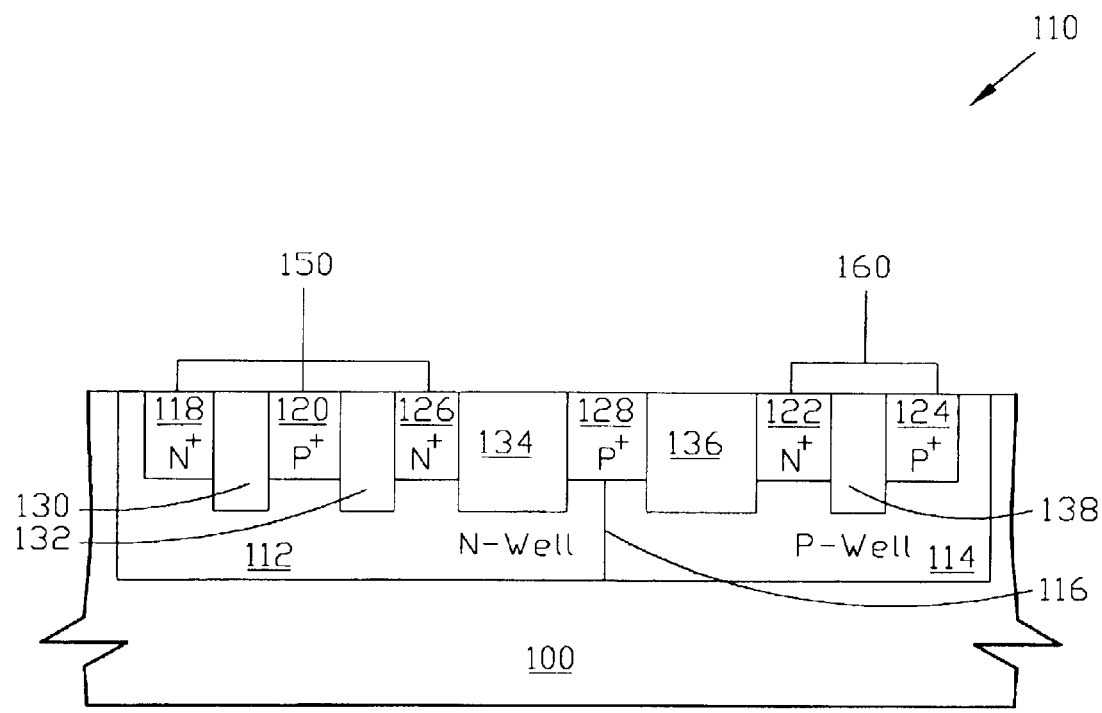
FIG. 1 is schematic representation showing a cross-section view of the conventional PMSCR with N guard ring structure.
Figure 2:
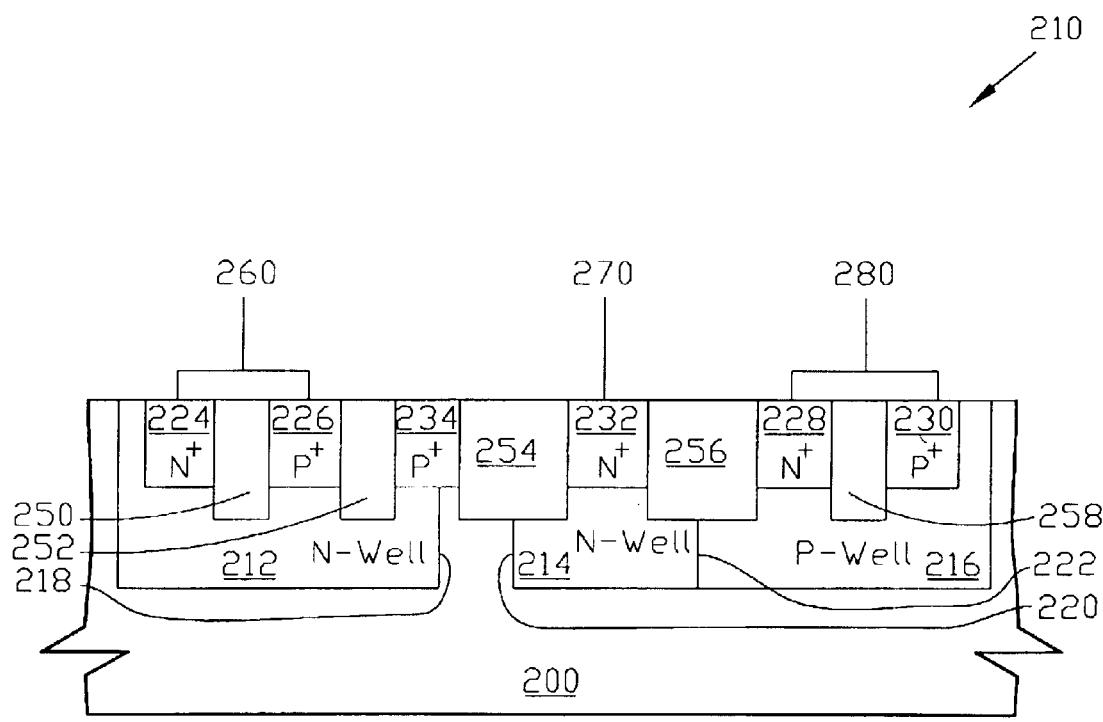
FIG. 2 is schematic representation showing a cross-section view of the conventional PMSCR with N well guard ring structure.
Figure 3:
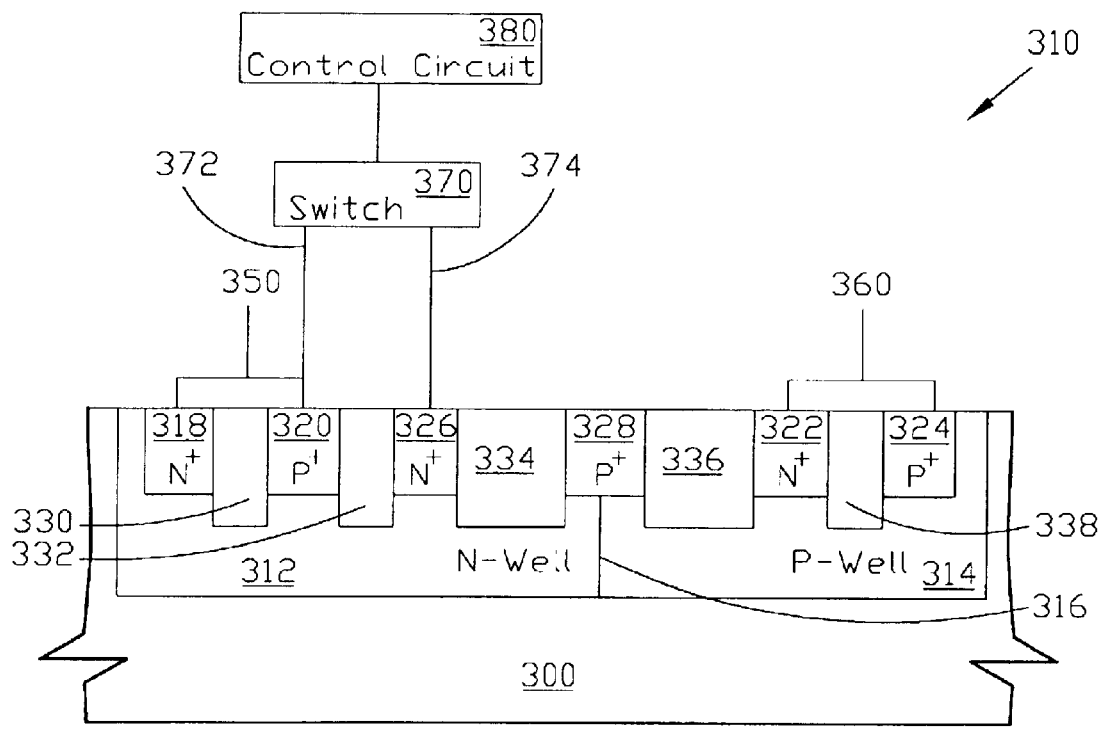
FIG. 3 is schematic representation showing a cross-section view of the PMSCR with controlled N guard ring structure in accordance with a structure disclosed herein.
Figure 4:
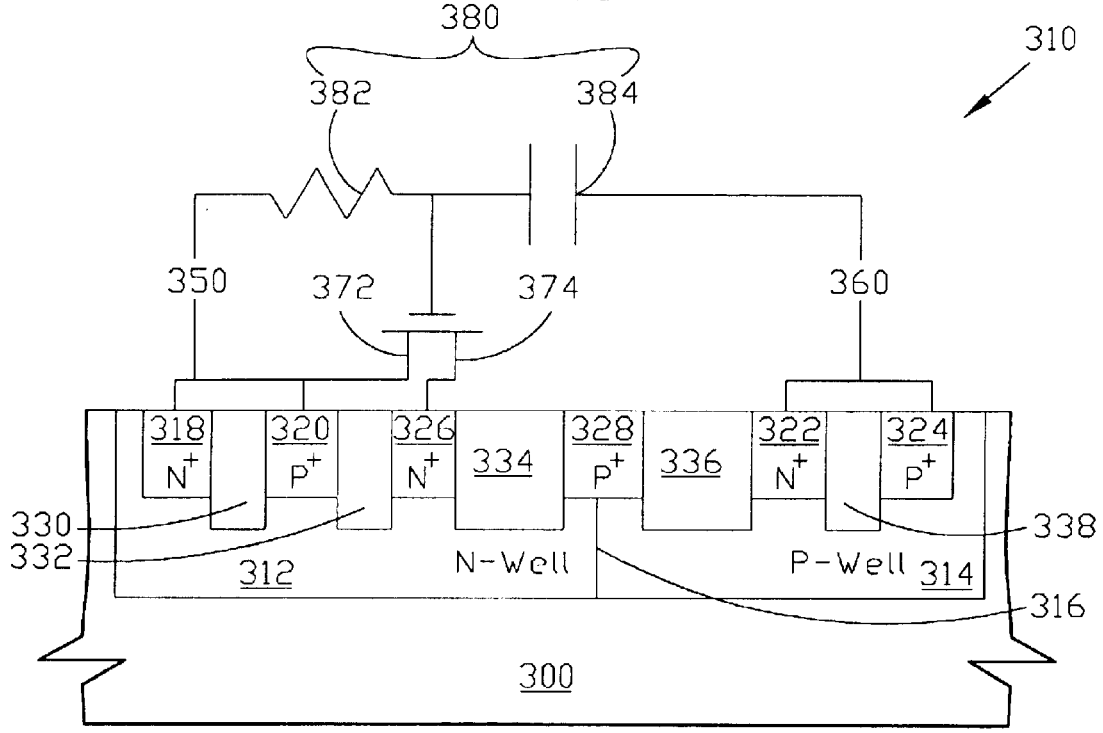
FIG. 4 is schematic representation showing a layout of the PMSCR with controlled N guard ring structure in accordance with a structure disclosed herein.

Referring to FIG. 3 and FIG. 4, the FIG. 3 showing a PMSCR with controlled N guard ring structure 310 (bridging modified lateral silicon controlled rectifier having a first conductivity type). The PMSCR with controlled N guard ring structure 310 is formed within a substrate 300, wherein the substrate 300 has the first conductivity. In the structure of the PMSCR with controlled N guard ring structure 310 include a first lightly doped well region 312 is formed within the substrate 300, wherein the first lightly doped well region 312 having a second conductivity type such as N type. In addition, a second lightly doped well region 314 is formed within the substrate 300 adjacent to the first lightly doped well region 312, wherein the second lightly doped well region 314 has the first conductivity type such as P type, and the first conductivity type opposites to the second conductivity type.

Then, a first heavily doped region 318 of the second conductivity type is formed within the first lightly doped well region 312, and is electrically coupled to the first node 350 such as anode. In the present invention, the concentration of the each heavily doped region is higher than each lightly doped well region in the substrate. Next, a second heavily doped region of the first conductivity type 320 is formed within the first lightly doped well region 312, and is electrically coupled to the first node 350, and is electrically coupled to a first terminal 372, and the first terminal 372 is electrically coupled to the switch 370, wherein the switch 370 can be a MOS (metal oxide semiconductor) transistor, and the function of the switch 370 is controlled by RC circuit (resistor-capacitor circuit) 380 (shown in FIG. 4). A third heavily doped region 322 of the second conductivity type is formed within the second lightly doped well region 314, and is electrically coupled to the second node 360 such as cathode. Next, a fourth heavily doped region 324 of the first conductivity type is formed within the second lightly doped well region 314, and is electrically coupled to the cathode 360. Thereafter, a fifth heavily doped region 326 of the second conductivity type as a controlled guard ring that is formed within the first lightly doped well region 312, and is electrically coupled to a second terminal 374, which is electrically coupled to the switch 370. Then, a sixth heavily doped region 328 of first conductivity type is formed between the first lightly doped well region 312 and the second lightly doped well region 314, such that the sixth heavily doped region 328 overlaps a junction 316 between the first lightly doped well region 312 and the second lightly doped well region 314.

Next, a first field insulator 330 such as isolation structure or field oxide region is formed in the first lightly doped well region 312 to be interposed between the first heavily doped region 318 and the second heavily doped region 320. A second field insulator 332 is formed in the first lightly doped well region 312 to be interposed between the second heavily doped region 320 and the fifth heavily doped region 326. Then, a third field insulator 334 is formed in the first lightly doped well region 312 to be interposed between the fifth heavily doped region 326 and the sixth heavily doped region 328. Next, a fourth field insulator 336 is formed in the second lightly doped well region 314 to be interposed between the sixth heavily doped region 328 and the third heavily doped region 322. Thereafter, a fifth field insulator 338 is formed in the second lightly doped well region 314 to be interposed between the third heavily doped region 322 and the fourth heavily doped region 324.

Referring to FIG. 4 is showing a layout of the FIG. 3. The reference number 380 is RC circuit; the reference number 382 is a resistor of the RC circuit 380; and the reference number 384 is a capacitor of the RC circuit 380. The RC circuit 380 acts as a control circuit. The RC circuit 380 is electrically coupled to switch 370, the anode 350, and the cathode 360. Furthermore, a first terminal 372 of the switch 370 is electrically coupled to the second heavily doped region 320, and a second terminal 374 of the switch 370 is electrically coupled to the controlled N guard ring 326, wherein the RC circuit 380 is used to control the function of the switch 370. The value of the resistor and the capacitor in this RC circuit 380 is chosen properly so that the turning-on speed of the RC circuit 380 is between that of the normal operation and that of the ESD event. In normal operation, if an excess voltage is applied to the PMSCR with a controlled N guard ring structure 310, the PMSCR with controlled N guard ring structure 310 will trigger. Furthermore, due to the response of the RC circuit 380 can keep up with the voltage rise of the HV pad in the normal operation, the state of the MOS transistor 370 is "on" and exhibits low impedance, such that the voltage of the HV pad (not shown) is coupled to the controlled N guard ring 326 through the MOS transistor 370, and such that the controlled N guard ring 326 collects the electrons flowing from the cathode 360 to the anode 350 to enhance the power-zapping immunity. Moreover, during the ESD (electrostatic discharge) event, due to the response of the RC circuit 380 cannot keep with the response of the current of the ESD such that the switch 370 is of high impedance (the state of the switch 370 is "off") and the controlled N guard ring 326 is useless. Thus, the ESD performance will not be degraded.

Figure 5:
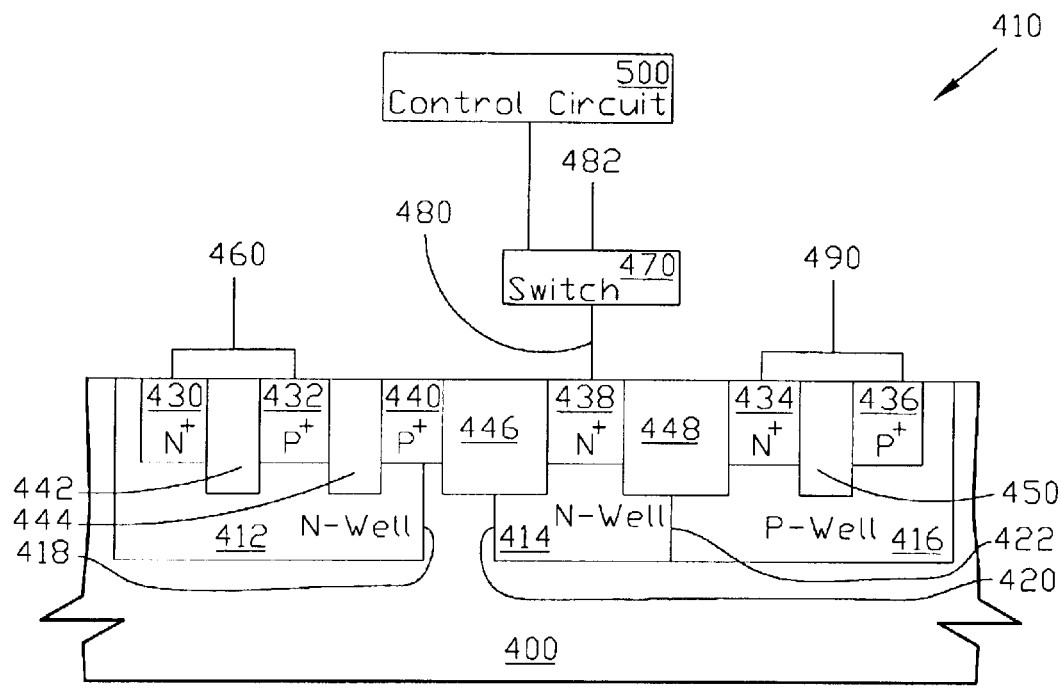
FIG. 5 is schematic representation showing a cross-section view of the PMSCR with controlled N well guard ring structure in accordance with a structure disclosed herein.
Figure 6:
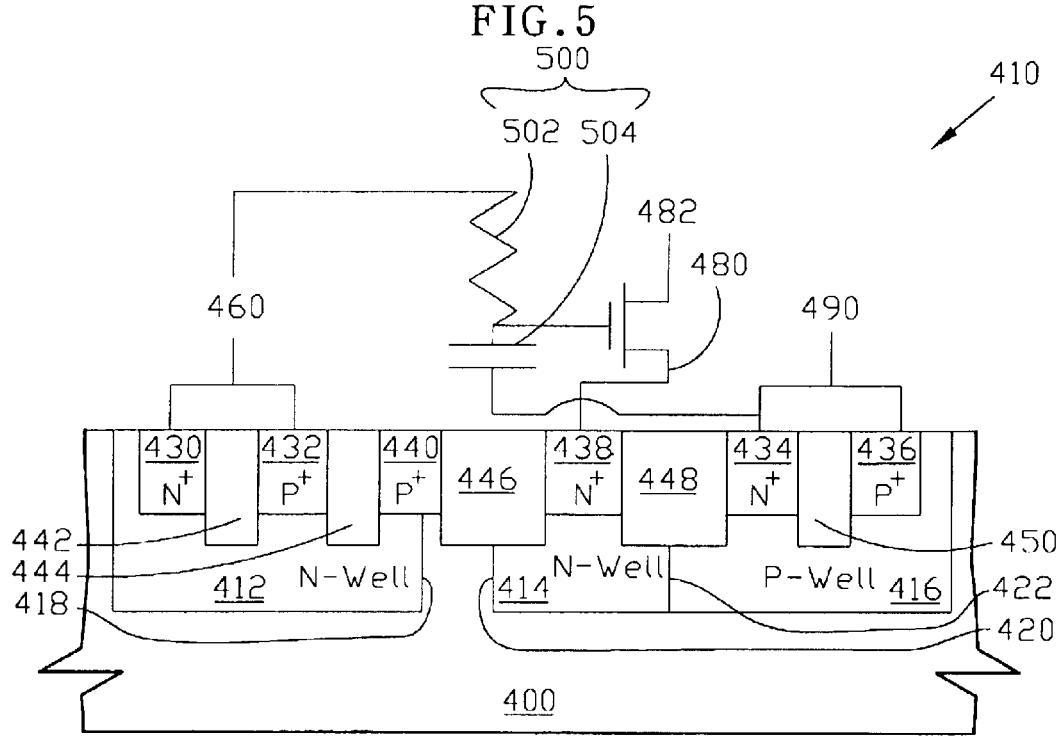
FIG. 6 is schematic representation showing a layout of the PMSCR with controlled N well guard ring structure in accordance with a structure disclosed herein.

Referring to FIG. 5 and FIG. 6, the FIG. 6 is schematic PMSCR with controlled N well guard ring structure 410 that is formed within the substrate 400. A first lightly doped well region 412 and a second lightly doped well region 414 are formed simultaneously within the substrate 400, wherein the first and second lightly doped well region 412, 414 having the second conductivity type such as N type. The embodiment of the present invention, the second lightly doped well region 414 is used as controlled N well guard ring to collect the electrons. In addition, a third lightly doped well region 416 of the first conductivity type is formed within the substrate 400 adjacent to the second lightly doped well region 414. Then, a first heavily doped region 430 of the second conductivity type is formed in the first lightly doped well region 412, and is electrically coupled to the first node 460, wherein the first node can be anode. Next, a second heavily doped region 432 of the second conductivity type is formed in the first lightly doped well region 412, and is electrically coupled to the first node 460. Thereafter, the third heavily doped region 434 is formed in the third lightly doped well region 416, and is electrically coupled to the third node 490, wherein the third node 490 can be cathode. Then, a forth heavily doped region 436 of the first conductivity type is formed in the third lightly doped well region 416, and is electrically coupled to the third node 490.

Next, a fifth heavily doped region 438 of the second conductivity type is formed in the second lightly doped well region 414, and is electrically coupled to the first terminal 480, and the first terminal 480 is electrically coupled to the switch 470, wherein the switch 470 is electrically coupled to the second node 482 such as anode or other high-voltage node. Thereafter, a sixth heavily doped region 440 of the first conductivity type is formed between the substrate 400 and first lightly doped well region 412, such that the sixth heavily doped region 440 overlaps the first junction 418 between the first lightly doped well region 412 and the substrate 400. Then, a first field insulator region 442 is formed in the first lightly doped well region 412 to be interposed between the first heavily doped region 430 and the second heavily doped region 432. Next, a second field insulator region 444 is formed in the first lightly doped well region 412 to be interposed between the second heavily doped region 432 and the sixth heavily doped region 440. Thereafter, a third field insulator region 446 is formed between the substrate 400 and the second lightly doped well region 414, and such that the third field insulator region 446 is interposed between the sixth heavily doped region 440 and the fifth heavily doped region 438. Then, a fourth field insulator region 448 is formed between the second lightly doped well region 414 and the third lightly doped well region 416, and such that the fourth insulator field region 448 is interposed between the fifth heavily doped region 438 and the third heavily doped region 434. Next, a fifth field insulator region 450 is formed in the third lightly doped well region 416 to be interposed between the third heavily doped region 434 and the fourth heavily doped region 436.

Then, referring to FIG. 6, the FIG. 6 is schematic the layout of the FIG. 5 for the PMSCR with controlled N well guard ring structure 410. The reference number 502 is a resistor of the RC circuit 500 and the reference number 504 is a capacitor of the RC circuit 500. In the present invention, RC circuit 500 controls the state (turn on or turn off) of the switch 470 to control the function of the controlled N well guard ring 414. The switch 470 is electrically coupled to the RC circuit 500; and a terminal 480 is electrically coupled to the fifth heavily doped region 438. Next, the RC circuit 500 is electrically coupled to the first node 460 and the third node 490.

As the PMSCR with controlled N guard ring structure 310, in the normal operation, if an excess positive voltage (Vdd) is applied to the PMSCR with a controlled N well guard ring structure 410 to generate a higher potential, it will trigger. Due to the response of the RC circuit 500 can keep up with the voltage rise of the normal operation, the state of the switch 470 is "on" and exhibits low impedance, such that the high voltage can be coupled flow from the HV pad to the controlled N well guard ring 414 through the MOS transistor 470, and such that the controlled N well guard ring 414 can collect the electrons from the third node 490 to the first node 460 to reduce the positive feedback of SCR and to avoid its entering the holding region. Thus, the power zapping immunity can be improved.

During ESD event, however, due to the turn-on speed of RC circuit cannot keep up with that of ESD, the switch 470 is "off" state and exhibits high impedance. Namely, N-well guard ring is floating and collects nothing. Accordingly, the positive feedback is not prohibited and PMSCR can enter the holding region. Thus, the ESD robustness will not be degraded. Moreover, one embodiment of the present invention, the first node 460 and the second node 482 can electrically couple to the different voltage, respectively. Therefore, the PMSCR with controlled N well guard ring 410 can be controlled by different application voltage. Furthermore, another embodiment of the present invention, the second node 482 can electrically couple to the first node 460, such that that the first node 460 and the second node 482 are electrically coupled to one application voltage. Therefore, the PMSCR with controlled N well guard ring 410 is controlled by one application voltage.

Although specific embodiments have been illustrated and described, it will be obvious to those skilled in the art that various modifications may be made without departing from what is intended to be limited solely by the appended claims.

What is claimed is:

1. A silicon controlled rectifier with a controlled guard ring structure comprising:

a first lightly doped well region of a second conductivity type and a second lightly doped well region of a first conductivity type in a substrate having said first conductivity, wherein said second lightly doped well region adjacent to said first lightly doped well region, and said second conductivity type opposites to said first conductivity type;

a first node is electrically coupled to a first heavily doped region of said second conductivity type and to a second heavily doped region of said first conductivity type, wherein an impurity concentration of each said heavily doped region is higher than each said lightly doped well region;

a second node is electrically coupled to a fourth heavily doped region having said first conductivity type and to a third heavily doped region having said second conductivity type, wherein the polarity type of said second node opposites to said first node;

a switch having a first terminal and a second terminal, wherein said first terminal is electrically coupled to said first heavily doped region and said second terminal is electrically coupled to a fifth heavily doped region having said second conductivity type within said first lightly doped region; and a control circuit is electrically coupled to said switch.

2. The silicon controlled rectifier with a controlled guard ring according to claim 1, wherein said switch is a metal oxide semiconductor transistor.

3. The silicon controlled rectifier with a controlled guard ring according to claim 1, wherein said first node is anode.

4. The silicon controlled rectifier with a controlled guard ring according to claim 1, wherein said second node is cathode.

5. The silicon controlled rectifier with a controlled guard ring according to claim 1, wherein said fifth heavily doped region is a controlled guard ring.

6. A silicon controlled rectifier with a controlled guard ring structure comprising:

a substrate having a first conductivity type, a first lightly doped well region having a second conductivity type, and a second lightly doped well region having said first conductivity type adjacent to said first lightly doped well region within said substrate, wherein said second conductivity type opposites to said first conductivity type;

a first heavily doped region having said second conductivity type in said first lightly doped well region;

a second heavily doped region having said first conductivity type in said first lightly doped well region;

a third heavily doped region having said second conductivity type in said second lightly doped well region;

a fourth heavily doped region having first conductivity type in said second lightly doped well region;

a fifth heavily doped region having said second conductivity type in said first lightly doped well region;

a sixth heavily doped region having said first conductivity type in said first lightly doped well region and in said second lightly doped well region, such that said sixth heavily doped region overlaps a junction between said first lightly doped region and said second lightly doped well region;

an anode is electrically coupled to said first heavily doped region and to said second heavily doped region;

a switch having a first terminal and a second terminal, wherein said first terminal electrically coupled to said second heavily doped region and said second terminal electrically coupled to said fifth heavily doped region;

a control circuit is electrically coupled to said switch; and a cathode is electrically coupled to said third heavily doped region and to said fourth heavily doped region.

7. The silicon controlled rectifier with a controlled guard ring structure according to claim 6, wherein said fifth heavily doped region is a controlled guard ring.

8. The silicon controlled rectifier with a controlled guard ring structure according to claim 6, wherein said switch is a metal oxide semiconductor transistor.

9. The silicon controlled rectifier with a controlled guard ring structure according to claim 6, wherein said control circuit is a resistor-capacitor circuit.

10. The silicon controlled rectifier with a controlled guard ring structure according to claim 9, wherein said control circuit controlling the function of said switch.

* * * * *